United States Patent [19]

Le

[11] 4,293,802
[45] Oct. 6, 1981

[54] TRANSRESONANT DEFLECTION YOKE OPERATIONS

[75] Inventor: Trung Le, Austin, Tex.

[73] Assignee: International Business Machines Corporation, Armonk, N.Y.

[21] Appl. No.: 105,322

[22] Filed: Dec. 19, 1979

[51] Int. Cl.³ .............................................. H01J 29/70
[52] U.S. Cl. .................................................... 315/387
[58] Field of Search ......................................... 315/387

[56] References Cited

U.S. PATENT DOCUMENTS

| | | | |
|---|---|---|---|
| 2,479,081 | 8/1949 | Poch | 315/387 X |
| 2,545,346 | 3/1951 | Edelsohn | 315/387 |
| 3,501,583 | 3/1970 | Schwartz | 315/387 X |
| 3,508,109 | 4/1970 | Congdon | 315/387 |
| 3,515,933 | 6/1970 | Myers | 315/387 |
| 3,529,206 | 9/1970 | Rodal | 315/387 X |
| 3,745,477 | 7/1973 | Freeborn | 330/13 |
| 3,757,155 | 9/1973 | Waehner | 315/387 |

OTHER PUBLICATIONS

"Optimum Utilization of Magnetic Deflection Yokes" by Hugh Connell Masterman, Submitted in Partial Fulfillment of the Requirements for the Degrees of Bachelor of Science and Master of Science at the Massachusetts Institute of Technology, Jun. 1971.

*Primary Examiner*—Malcolm F. Hubler
*Attorney, Agent, or Firm*—Douglas H. Lefeve

[57] ABSTRACT

An electromagnetic deflection yoke for a cathode ray tube (CRT) stroke display system is operated above its resonant frequency to allow faster writing speeds and the use of a single pair of XY deflection yokes for both position and write deflection. Operation above resonant frequency is accomplished by the inclusion of a second-order feedback network tuned to the frequency characteristics of the deflection yoke and associated shunt capacitance. Differing from prior art systems, the current applied as a feedback signal to an input of the yoke driver amplifier in a closed loop system is directly proportional to actual, instantaneous inductive component of the yoke current and to this component only.

10 Claims, 6 Drawing Figures

TRANSRESONANT DEFLECTION YOKE OPERATIONS

DESCRIPTION

1. Technical Field

This invention relates to circuitry for display devices in which alphanumeric symbols, graphics, or patterns are specified by strokes on the screen of a cathode ray tube (CRT). More specifically, this invention is primarily directed to a technique for substantially increasing the bandwidth of CRT electromagnetic deflection yoke operation by circuitry which allows the deflection yoke to be driven at a frequency that exceeds its natural resonant frequency.

2. Background Art (Prior Art Statement)

Representative of the closest known prior art is U.S. Pat. No. 3,745,477 to J. C. Freeborn, filed Jan. 26, 1972, issued July 10, 1973, entitled "Amplifier Apparatus for Use with an Inductive Load," and a thesis by Hugh Connell Masterman entitled "Optimum Utilization of Magnetic Deflection Yokes" submitted to the Massachusett Institute of Technology in 1977.

CRT directed beam display systems employing conventional magnetic deflection yokes and yoke driver circuits are well known in the prior art. Two characteristics that are often desirable in such systems are a relatively large screen and a relatively rapid refresh rate. Larger screens are desirable to allow more alphanumeric text characters, symbols, or graphics to be displayed than was previously common in the prior art. Rapid refresh rates are necessary to prevent apparent flicker to the viewer.

As the number of component images on a given sized CRT screen is increased there is a need to deflect the beam at a faster rate and a higher bandwidth if the frame refresh rate remains constant. When systems are compared on the basis of CRT screen size, the system having the larger screen must have the CRT electron beam deflected further away from the center of the screen than is the case with the CRT beam of the smaller tube. As deflection distance is increased the inductance of the deflection yoke must be increased if current, and, therefore, power is held constant. The greater inductance provides an increased magnetic field for CRT beam deflection but has the drawback of slowing the rate of deflection. In addition, the inductor combines with its inherent distributed capacitance to form a resonant circuit at which resonant frequency the deflection error exceeds fifty percent. As the frequency of yoke driving current increases, more and more of the current flows through the distributed capacitance rather than through the inductance to provide deflection.

Feedback from the yoke circuit to the yoke driver circuit has been used in the prior art in an attempt to compensate for the non-linearity of applied deflection current to CRT beam deflection as the frequency of the deflection current increases. Prior art feedback circuits sample the current flowing out of the yoke circuit as a whole. At very low frequencies substantially all of the current flowing out of the yoke circuit is inductive and very little current flows through the distributed capacitance. However, at high frequencies a much greater portion of the current flowing out of the yoke circuit flows through the distributed capacitance of the yoke rather than through the inductive portion of the circuit. In the prior art a rule of thumb has been to operate the yoke no higher than one-half of the frequency of the parallel resonant circuit formed by the yoke inductance and the distributed capacitance across the yoke.

If this rule of thumb is violated, uncontrolled response at high frequency results, including possible oscillation. U.S. Pat. No. 3,745,477 is an example of an attempt to control the feedback response. This patent is based on the correct belief that merely sampling the current exiting in the yoke and feeding back a portion of this current is not sufficient. The patent then suggests a sampling RC network in parallel with the yoke. Though the distributive capacitance is mentioned, the design did not take it into consideration. The current being fed back to the input summing node is not the beam deflecting inductive current; hence, this approach cannot be used as a means of expanding bandwidth.

The Masterman thesis suggests a compensation scheme that involves a first-order feedback network adding a single pole to the loop gain. This allows an improved response of the deflection yoke driver at a higher percentage of the resonant frequency of the yoke when compared to uncompensated prior art circuits. However, since here again the feedback current is not directly proportional to the inductive current, operation at and above resonance is not feasible.

Another design expedient commonly found in relatively large screen CRT stroke display circuits is the use of two separate sets of deflection yokes. One set of deflection yokes has a relatively large inductance and is used to position the beam at an appropriate place, for example, at the CRT screen location of an alphanumeric character to be stroked. After the beam is so positioned another set of deflection yokes having relatively small inductance is used to move the beam the relatively small distance required to provide the strokes necessary for the particular alphanumeric character. The higher speed deflection takes place during the stroking of the character and the relatively low inductance of the yoke used for the actual stroking (the write yoke) allows this high frequency operation with relatively low power, since the deflection distance is very limited. This type of dual yoke arrangement, however, is complex and expensive compared to a single yoke arrangement.

If a deflection system is to be simplified into an inexpensive system using a single yoke and a single deflection driver, operation at or above the resonant frequency of the yoke circuit would be highly advantageous in achieving a high performance display system which is capable of displaying a large amount of information with a rapid refresh rate.

SUMMARY OF THE INVENTION

Accordingly, the deflection system of the present invention achieves substantially greater bandwidth by operation of the deflection yoke above its resonant frequency. This is accomplished by the inclusion of a second-order feedback network in series with the yoke. This network can be a parallel resonant circuit having the same resonant frequency as the deflection yoke. The current from this network, applied as a feedback signal to a summing input of the yoke driver amplifier in a closed loop system, is directly proportional to actual, instantaneous inductive yoke current.

The second, parallel resonant feedback network uses two energy storage elements. Typically, a capacitor is positioned in the circuit such that, with increasing frequency, an increasing amount of yoke current is shunted to ground, thus, bypassing the summing terminal. In the same circuit an inductor is positioned such that, with increasing frequency, an increasing amount of yoke current is blocked from passing through the feedback network.

Alternatively, instead of a capacitor/inductor combination in the feedback network, the network comprises a pair of capacitors satisfying the above conditions of preventing an increasing amount of yoke current from reaching the summing input as the frequency of yoke driving current is increased.

With this feedback technique, the resonant frequency of the yoke circuit is no longer a limitation and operation of the circuit above its resonant frequency is quite practical. Thus, the bandwidth of a single yoke system can readily be designed to be high enough to provide both position and write deflection capabilities without the use of two pairs of yokes. This very substantially decreases the price/performance ratio of the display system.

The foregoing and other objects, features, extensions, and advantages of the invention will be apparent from the following more particular description of preferred embodiments of the invention, as illustrated in the accompanying drawing.

DESCRIPTION OF THE PREFERRED EMBODIMENTS

Figure 1:
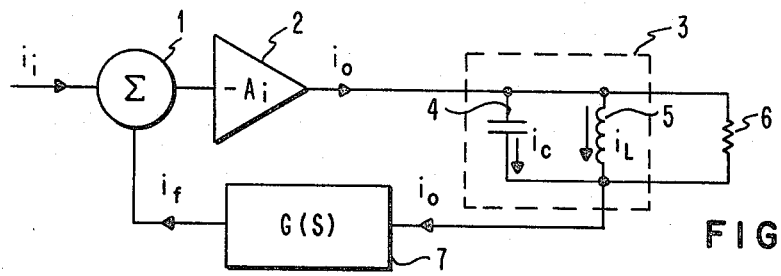
FIG. 1 is a generalized circuit diagram which shows a deflection yoke being driven in a closed loop feedback circuit.

Referring now to FIG. 1 a generalized circuit diagram is shown of a deflection yoke being driven in a closed loop feedback circuit. A current $i_i$ which is representative of a desired deflection distance is applied to a summing circuit 1. The output of summing circuit 1 is applied to a driver amplifier 2 to generate a current $i_o$ that is applied to the deflection yoke 3. The current $i_o$ leaving the deflection yoke 3 is applied to the input of a feedback circuit 7 which provides an output current $i_f$ which is applied back to the summing node 1. The existence of the feedback loop sets the gain or amplification ratio of $i_L$ with respect to $i_i$ such that $i_L = (K)i_i$. In prior art circuits the ratio $i_o = (K)i_i$ has been maintained.

It should be noted that yoke 3 is comprised of an inductive yoke winding 5 and an inherent distributed capacitance 4 which is in a parallel circuit with the yoke winding 5. The current $i_o$, therefore, is the sum of the currents $i_c$ through capacitor 4, $i_L$ through yoke winding 5, and any current flow through damping resistor 6 usually required to critically damp the yoke. All of these current components change with frequency. That is, as frequency increases, the capacitive current $i_c$ also increases and the inductive current $i_L$ decreases.

Figure 2:
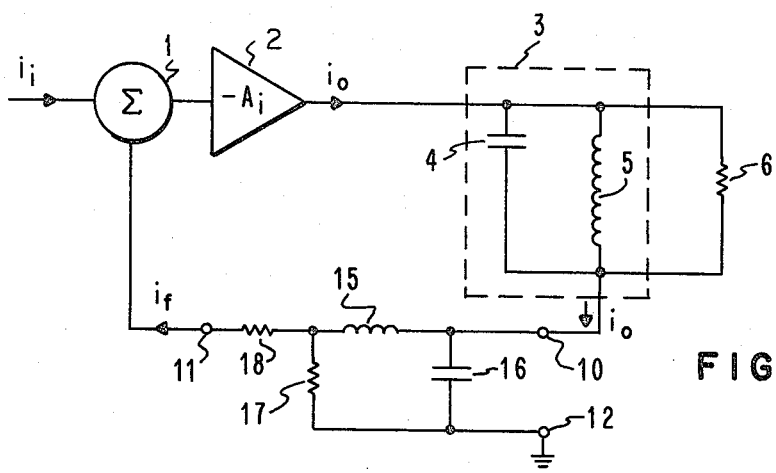
FIG. 2 shows a closed loop feedback deflection circuit employing a parallel resonant circuit in the feedback loop.

At relatively low frequencies the inductive current $i_L$ is closely approximated by the composite yoke current $i_o$. However, as the frequency of operation becomes a significant percentage of the resonant frequency of the parallel circuit formed by yoke winding 5 and capacitance 4, the percentage of $i_o$ attributable to $i_L$ decreases and the beam deflecting current is no longer the product of $i_i$ multiplied by a constant. To the extent that the transfer function G(S) of the feedback network 7 is related to all of the components of the current $i_o$, including $i_c$, $i_L$, and the current through resistor 6, the circuit represents a prior art circuit as described above. However, the circuit of FIG. 1 is shown in a generalized form and is representative of the present invention if the transfer function G(S) is considered to feedback a current $i_f$ that is representative only of the instantaneous inductive yoke winding current $i_L$, as opposed to all or any combination of components of current flowing through the yoke circuit. FIG. 2 shows an example of a circuit to achieve such a result.

In FIG. 2 the current $i_o$ flowing out of the yoke circuit is applied to terminal 10 of a feedback network comprising capacitor 16, inductor 15, and resistors 17 and 18. This feedback network represents a second-order circuit in series with the resonant circuit formed by the inductive yoke winding 5 and the distributed capacitance 4 of deflection yoke 3. When this second-order circuit is configured to have the same frequency characteristics as yoke 3, the feedback current $i_f$ represents a constant portion of the inductive current $i_L$ only. Thus, the relationship $i_f = (K)i_i$ is achieved.

Within limits of driver amplifier 2, this relationship is frequency-invariant, and therefore, operational frequencies above the resonant frequency of yoke 3 can be achieved.

Figure 3:
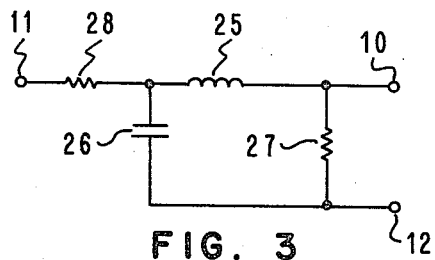
FIGS. 3-6 are schematic diagrams of other parallel resonant feedback circuits which may be employed in accordance with the present invention.
Figure 4:
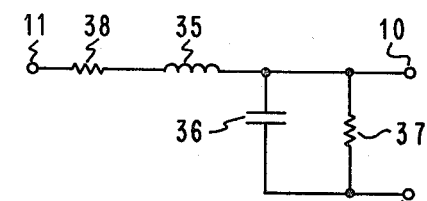
Figure 5:
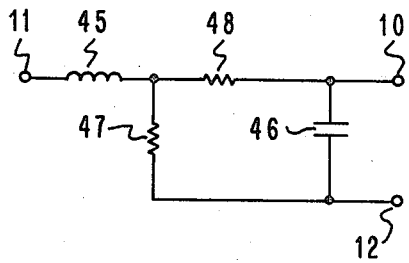

In the feedback portion of the circuit of FIG. 2 it is noted that a capacitor is positioned in the circuit such that, with increasing frequency, an increasing amount of yoke current is shunted to ground. In this circuit an inductor is positioned such that, with increasing frequency, an increasing amount of yoke current is prevented from reaching the summing node 1. The circuits in FIGS. 3-5 are also readily useable in place of the feedback circuit in FIG. 2. In each of FIGS. 3-5 terminals 10, 12, and 11 are shown such that the networks in FIGS. 3-5 can be directly connected into the circuit of FIG. 2 after removal of the feedback network used in FIG. 2. In each of FIGS. 3-5 the same design philosophy as that in the feedback network of FIG. 2 is incorporated. That is, a capacitor is positioned such that with increasing frequency an increasing amount of yoke current is shunted to ground, while an inductor is positioned such that, with increasing frequency, an increasing amount of yoke current is prevented from reaching the summing node 1.

Figure 6:
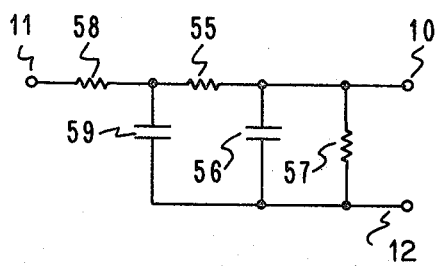

Another feedback circuit is shown in FIG. 6 which also accomplishes this result without the use of inductors. This may provide greater ease in the implementation of the circuit. In FIG. 6, yoke current is shunted to ground through two different paths causing it to decrease with frequency at twice the rate achievable with one capacitor. The second capacitor 59 thus takes the place of the inductor in FIGS. 2-5 in diverting current from the summing junction.

It should be noted that each of the feedback networks in FIGS. 2 through 6 include two energy storage elements. This is a necessary but not a sufficient condition, alone, for providing an accurate feedback signal representative only of the inductive component of the current flowing through the deflection yoke. This allows operation at high frequencies including the resonant frequency of the yoke circuit and higher frequencies beyond the resonant frequency. With the high frequency operation, and, therefore, the high speed deflection capability of the yoke circuit, a single set of deflection yokes is useable both for positioning the CRT beam to an appropriate location for writing a character and also for moving the CRT beam at high speeds at that location to write the character. This provides a very substantial cost saving in the display system since deflection yokes and their associated driving circuitry represent a substantial expense.

While the invention has been shown and described with reference to particular embodiments thereof, it will be understood by those skilled in the art that the foregoing and other changes in form and details may be made therein without departing from the spirit and scope of the invention.

What is claimed is:

1. In a CRT display system having a deflection yoke having frequency characteristics defined by the inductance of and the distributed capacitance across said yoke and a driving amplifier circuit therefor, said circuit having an output connected to a first end of said yoke and a summing node receiving a signal corresponding to a desired CRT beam deflection and a feedback signal related to deflection yoke current, the improvement comprising:

a second-order feedback network including the equivalent of only two energy storage devices, said feedback network being tuned to said yoke frequency characteristics and having only one input terminal, one output terminal, and a ground terminal;

means for connecting said input terminal to a second end of said deflection yoke and said output terminal to said summing node; and means for applying a signal from said feedback network to said summing node of said driver amplifier circuit, said signal being related by a constant factor to the instantaneous inductive current flow through said deflection yoke.

2. In a CRT display system of claim 1 wherein said second-order feedback network comprises;

a capacitor connected such that an increasing amount of said current flow through said yoke is shunted to ground as the frequency of said current increases; and a first inductor positioned such that an increasing amount of current flow through said yoke is blocked from passage into said summing node as the frequency of said current increases.

3. In a CRT display system of claim 1 wherein said second-order feedback network comprises:

a capacitor connected between said yoke and ground potential, and;

a first inductor connected between said yoke and said summing node so that current from said yoke to said summing node must pass through said inductor.

4. In a CRT display system of claim 1 wherein said second-order feedback network comprises a first resistor connected between said yoke and ground potential, a second resistor having one end connected to said summing node and another end connected at a junction of one end of a first inductor and one end of a first capacitor;

another end of said first capacitor being connected to ground potential and another end of said first inductor being connected to said yoke.

5. In a CRT display system of claim 1 wherein said second-order feedback network comprises the parallel combination of a first resistor and a first capacitor being connected between said yoke and ground potential, a second resistor having one end connected to said summing node and another end connected at a junction of one end of a third resistor and one end of a second capacitor;

another end of said second capacitor being connected to ground potential and another end of said third resistor being connected to said yoke.

6. In a CRT display system of claim 1 wherein said second-order feedback network comprises a first capacitor connected between said yoke and ground potential, a first resistor having one end connected to said summing node and another end connected at a junction of one end of a first inductor and one end of a second resistor;

another end of said second resistor being connected to ground potential and another end of said first inductor being connected to said yoke.

7. In a CRT display system of claim 1 wherein said second-order feedback network comprises a first capacitor connected between said yoke and ground potential, a first inductor having one end connected to said summing node and another end connected at a junction of one end of a first resistor and one end of a second resistor;

another end of said first resistor being connected to ground potential and another end of said second resistor being connected to said yoke.

8. In a CRT display system of claim 1 wherein said second-order feedback network comprises a first resistor and a first inductor connected in series between said yoke and said summing node and a first capacitor and a second resistor connected in parallel between said yoke and ground potential.

9. In a CRT display system of claim 1 wherein said second-order feedback network comprises a parallel resonant circuit.

10. In a CRT display system of claim 9 wherein said frequency characteristics of said yoke define a resonant frequency f, of said yoke and wherein the resonant frequency of said parallel resonant circuit of said second-order feedback network is f.

* * * * *